United States Patent

Matsuura

Patent Number: 5,452,700
Date of Patent: Sep. 26, 1995

[54] DRIVING CIRCUIT OF A FUEL INJECTOR FOR AN ENGINE AND THE CONTROL METHOD THEREOF

[75] Inventor: Takashi Matsuura, Tokyo, Japan

[73] Assignee: Fuji Jukogyo Kabushiki Kaisha, Tokyo, Japan

[21] Appl. No.: 234,926

[22] Filed: Apr. 28, 1994

[30] Foreign Application Priority Data

May 21, 1993 [JP] Japan .................. 5-120194

[51] Int. Cl.$^6$ .................. F02D 41/30; H01H 47/32
[52] U.S. Cl. .................. 123/490; 361/152
[58] Field of Search .................. 123/467, 490; 361/152, 154, 159

[56] References Cited

U.S. PATENT DOCUMENTS

| | | | |
|---|---|---|---|
| 4,605,983 | 8/1986 | Harvey | 123/490 |
| 4,612,597 | 9/1986 | Hamren | 123/490 |
| 4,944,281 | 7/1990 | Suquet | 123/490 |
| 5,053,911 | 10/1991 | Kopec et al. | 123/490 |
| 5,216,994 | 6/1993 | Aoki et al. | 123/490 |
| 5,277,163 | 1/1994 | Ohishi | 123/490 |
| 5,285,345 | 2/1994 | Blumel et al. | 123/490 |
| 5,341,032 | 8/1994 | Brambilla et al. | 123/490 |

*Primary Examiner*—Willis R. Wolfe
*Attorney, Agent, or Firm*—Beveridge, DeGrandi, Weilacher & Young

[57] ABSTRACT

A current flowing to a fuel injector is completely cut off when an injection pulse signal is OFF at a timing to stop conduction of the fuel injector to reliability close the fuel injector, and when an injection pulse signal is OFF at a timing to stop conduction of an injector, an output transistor of a comparator is on to forcibly set a base potential of a switching transistor to a low level so as to completely cut off the switching transistor. At this time, a control signal output of an AND gate becomes a logic "0", but an actual signal voltage does not become completely "0", but even when a comparator is erroneously operated, the switching transistor is completely cut off by the comparator, and hence no current flows to the injector, and a small current continuously does not flow to the injector to prevent a valve closing force from being weakened.

3 Claims, 4 Drawing Sheets 5,452,700

DRIVING CIRCUIT OF A FUEL INJECTOR FOR AN ENGINE AND THE CONTROL METHOD THEREOF

BACKGROUND OF THE INVENTION

This invention relates to a driving circuit of a fuel injector for an engine for controlling the fuel injector in accordance with an injection pulse signal and a method for controlling the same.

In general, in a fuel injection system for injecting pressurized fuel through a fuel injector of an electromagnetic valve to an engine, the fuel injector to be opened and closed at a high speed is required to expand a dynamic range. Thus, a driving circuit of the fuel injector is required to reduce an inductance and a resistance value of the fuel injector and to hence control a current in accordance with the inductance and the resistance value of the fuel injector.

Japanese Patent Application Laid-Open 57-203831 and Japanese Utility Model Laid-Open 60-47852 disclose, for example, a driving circuit of a fuel injector for controlling to initially supply a relatively large current to move a valve body of the fuel injector at a high speed against the static friction resistance when an injection pulse signal for designating an injection time of the fuel injector is ON and then to supply a small holding current necessary to hold an opening state of the fuel injector.

In this case, in order to control the current flowing to the fuel injector to a target value, a current detecting resistor having a small resistance value is connected in series with the fuel injection, a potential difference between both ends of the current detecting resistor is compared by a comparator with a control signal formed in accordance with an injection pulse signal by a logic circuit using various gates and comparators, and a transistor for driving the fuel injector is operated in accordance with a comparison output of the comparator.

However, a logic level of the signal formed by the various gates and the comparators has a width as known. A voltage level of the actual signal even in the case of a high level of the same logic "1" or a low level of the same logic "0" is different in accordance with an irregularity among types or individual elements of logic elements.

Therefore, even if the voltage level of the control signal becomes the logic level "0" in the comparator for comparing the potential across the current detecting resistor with the control signal on the basis of the injection pulse signal when the injection pulse signal becomes OFF to become a timing for stopping the fuel injector, the voltage level does not become completely "0", and the voltage level of the actual control signal might sometimes exceed the potential difference between both ends of the current detecting resistor.

More specifically, when the injection pulse signal becomes OFF to become the timing for stopping the fuel injector, a so-called offset voltage is generated at the control signal formed on the basis of the injection pulse signal, the transistor for driving the fuel injector is not completely shut off, but a small current flows to the transistor to cause the closing force of the fuel injector to become small, and hence the fuel might be leaked from the fuel injector.

SUMMARY OF THE INVENTION

An object of the present invention is to provide a driving circuit of a fuel injector for an engine which overcomes various subjects of a conventional driving circuit of the fuel injector and which completely cut off a current flowing to the fuel injector when an injection pulse signal becomes OFF at the timing for stopping the fuel injector and reliably closes the fuel injector.

In order to achieve the above object, this invention provides a driving circuit of a fuel injector for an engine having, an intake passage connected with an intake port of said engine for inducing a fresh air into said engine, an injector mounted on a top of a cylinder head for directly injecting a fuel into a cylinder, a fuel supply system connected from a fuel tank to said injector via a pump and a pressure regulator, an electronic control unit for calculating an injection pulse of said injector and for generating a pulse signal, and an injection pulse input terminal provided in an interface of said electronic control unit for outputting said pulse signal, an improvement of the driving circuit which comprises driving means responsive to said pulse signal for calculating a control voltage to actuate said injection and for producing a control signal; switching means responsive to said control signal for controlling to open at two predetermined values and to close said injector and for generating a switching signal; and a shut-off circuit connected between said injection pulse input terminal and said switching means in parallel with said driving means for forcibly cutting off said switching means when said pulse signal is OFF so as to completely cut off said switching signal to said switching means and to avoid said fuel from leaking in said injector.

When the injection pulse signal for designating an injection time of the fuel injector is off, a signal for forcibly cutting off the transistor for driving the fuel injector is outputted from a separate system from the control signal formed from the injection pulse signal.

The nature, utility, and further features of this invention will be understood from the following detailed description with respect to preferred embodiments of the invention by referring the accompanying drawings, briefly described below.

DETAILED DESCRIPTION OF THE INVENTION

The embodiment of the present invention will be explained with reference to accompanying drawings.

Figure 3:
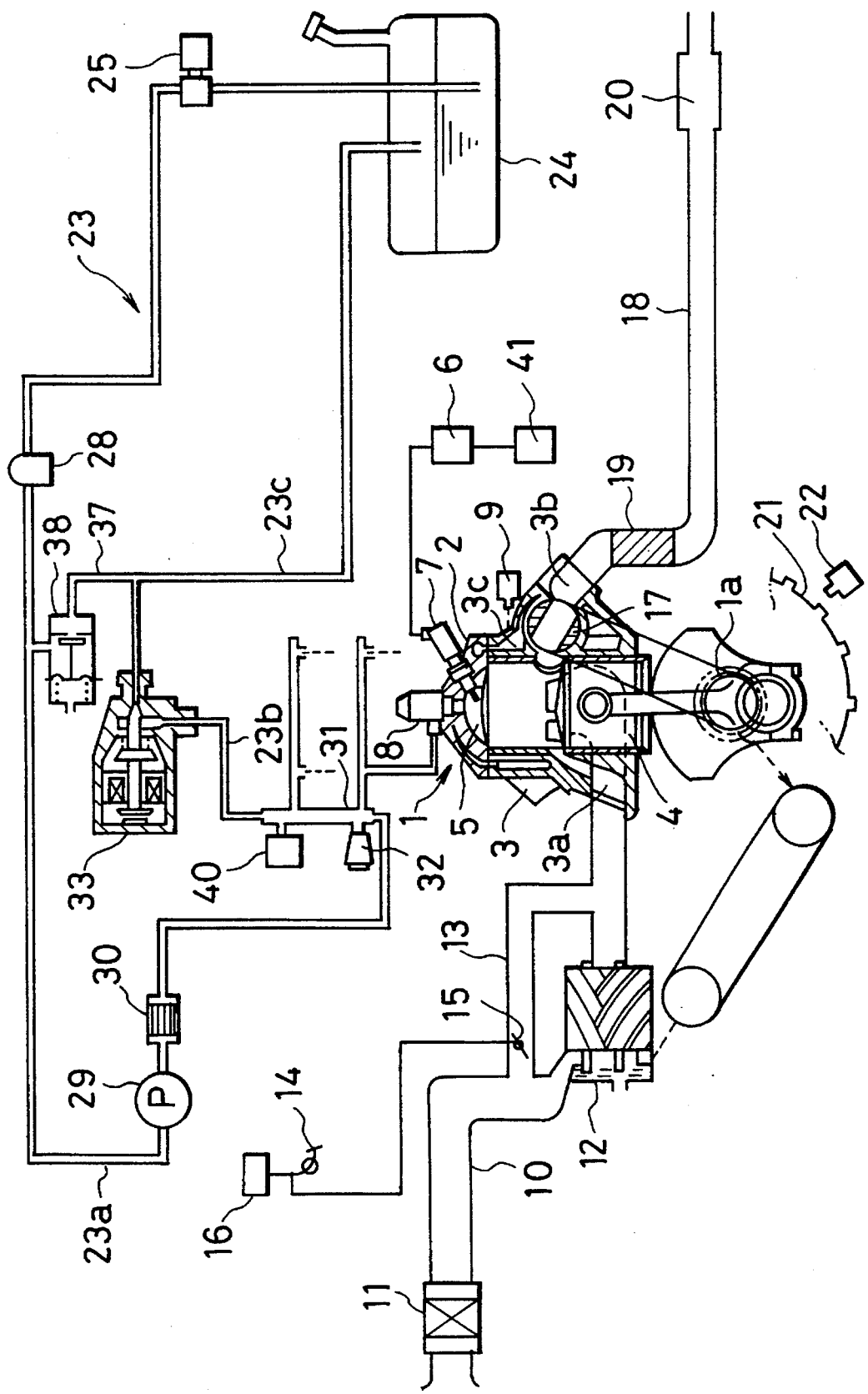
FIG. 3 is a schematic diagram of an engine control system.

Referring to FIG. 3, numeral 1 indicates a high-pressure injection type engine (two-cycle direct fuel injection four-cylinder gasoline engine). A spark plug 7 connected to a secondary side of an ignition coil 6 and a fuel injector 8 for directly injecting fuel into a combustion chamber 5 formed of a cylinder block 3, a cylinder head 2 and a piston 4 of the engine 1 are provided in the combustion chamber 5. A scavenge port 3a and an exhaust port 3b are formed in the cylinder block 3, and a coolant temperature sensor 9 is provided in a coolant passage 3c formed in the cylinder block 3.

An intake pipe 10 is connected with the scavenge port 3a of the cylinder block 3. An air cleaner 11 is mounted at an upstream side of the intake pipe 10, and a scavenge pump 12 to be driven by a crankshaft 1a is provided at a downstream side of the intake pipe 10. Fresh air is supplied by the scavenge pump 12 to the combustion chamber 5 to forcibly scavenge the combustion chamber 5. A bypass control valve 15 operatively connected to an accelerator pedal 14 is provided in a bypass passage 13 for bypassing the scavenge pump 12, and an accelerator depression degree sensor 16 is operatively connected with the accelerator pedal 14.

A rotary exhaust valve 17 operatively connected to the crankshaft 1a to be opened and closed is provided in the exhaust port 3a of the cylinder block 3, and an exhaust pipe 18 is connected with the rotary exhaust valve 17. Further, a catalytic converter 19 is provided in the exhaust pipe 18, and a muffler 20 is connected to a downstream side of the exhaust pipe 18.

A crank rotor 21 is journaled at the crankshaft 1a supported to the cylinder block 3, and a crank angle sensor 22 formed of an electromagnetic pickup is opposed to an outer periphery of the crank rotor 21.

Numeral 23 designates a fuel system. The fuel system 23 has a low-pressure fuel system 23a for supplying fuel from a fuel tank 24 to an engine drive type high-pressure fuel pump 29 through a feeding pump 25 and a fuel filter 28, a high-pressure fuel system 23b for supplying a predetermined high-pressure fuel from a high-pressure fuel pump 29 to an electromagnetic high pressure regulator 33 through a high-pressure fuel filter 30, and a fuel supply passage 31 connected to injectors 8 of the respective cylinders, and a fuel return system 23c for returning excess fuel from the electromagnetic pressure regulator 33 to the fuel tank 24.

A fuel bypass passage 37 is connected between the fuel filter 28, the high-pressure fuel pump 29 of the low-pressure fuel system 23a and the fuel return system 23c, and a low-pressure regulator 38 for regulating the pressure of the fuel to be supplied to the high-pressure fuel pump 29 is connected to the fuel bypass passage 37. An accumulator 32 for buffering a pulsating pressure of the fuel is connected to the fuel supply passage 31, and a fuel pressure sensor 40 for detecting the fuel pressure is connected to the fuel supply passage 31.

Figure 4:
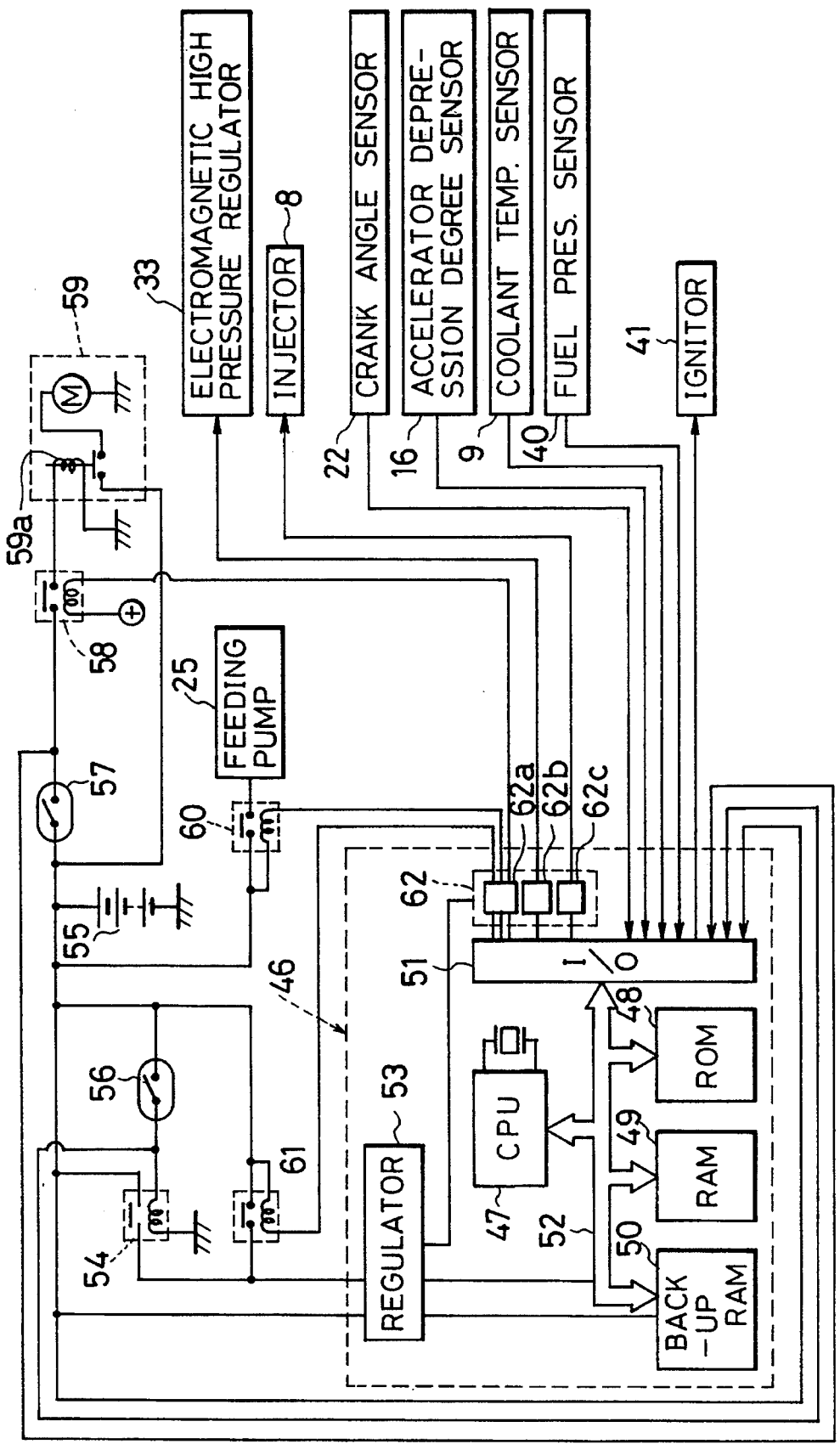
FIG. 4 is a view of an electronic control system.

Referring to FIG. 4, numeral 46 illustrates an electronic control unit (ECU). The ECU 46 has a CPU 47, a ROM 48, a RAM 49, a back-up RAM 50 and an I/O interface 51 connected to a microcomputer as a main section through a bus line 52.

The ECU 46 has a regulator 53 for supplying a stabilized voltage to the respective sections. The regulator 53 is connected to a battery 55 through a relay contact of an ECU relay 54, and a relay coil of the ECU relay 54 is connected to the battery 55 through an ignition switch 56. The relay contact of a self-shut relay 61 is connected in parallel with the ECU relay 54 and the ignition switch 56. A backup voltage is always applied from the regulator 53 to the back-up ROM 50.

A starter switch 57 is connected to the battery 55. A relay coil of a drive relay 59a of a starter motor 59 is connected to the starter switch 57 through the relay contact of a starter motor relay 58. When both the starter switch 57 and the starter motor relay 58 are ON, the relay contact of the drive relay 59a is ON, and the starter motor 59 is connected to the battery 55 and driven. Further, the feeding pump 25 is connected to the battery 55 through the relay contact of a feed pump relay 60.

The battery 55 is connected to an input port of the I/O interface 51 when the battery voltage is monitored. The I/O interface 51 connected with the ignition switch 56, the starter switch 57, the crank angle sensor 22, the accelerator depression degree sensor 16, the coolant temperature sensor 9 and the fuel pressure sensor 40.

The ignitor 41 for driving the ignition coil 6 is connected to an output port of the I/O interface 51. The output port of the I/O interface 51 is connected with a driving circuit 62. The driving circuit 62 has a relay driving circuit 62a, a high-pressure electromagnetic type pressure regulator driving circuit 62b, and an injector driving circuit 62c. The relay driving circuit 62a is connected with the relay coils of the starter motor relay 58, the feed pump relay 60, the self-shut relay 61. The relays 58, 60 and 61 are individually controlled. The electromagnetic high pressure regulator 33 is connected to the electromagnetic high pressure regulator driving circuit 62b. Further, the injector 8 is connected to the injector driving circuit 62c.

The injector driving circuit 62c is controlled to first supply a relatively large valve opening current to operate the injector 8 at a high speed against the static friction resistance when the injection pulse signal for designating the injection time of the injector 8 is ON and to then supply a relatively small holding current necessary to hold a valve opening state. When the injection pulse signal is OFF, the current of the injector 8 is reliably shut off to completely close the valve to prevent leakage of high-pressure fuel from the injector 8.

Figure 1:
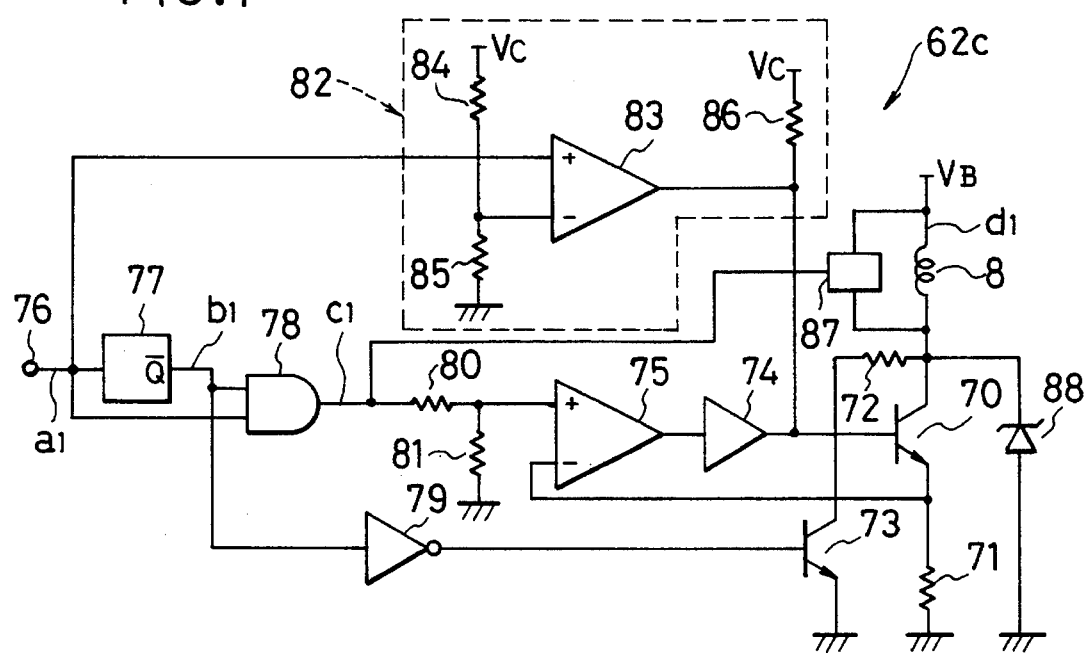
FIG. 1 is a circuit diagram of a driving circuit of a fuel injector.

A configuration of the injector driving circuit 62c will be described. As shown in FIG. 1, one terminal of the injector 8 is connected with a battery power source VB, and the other terminal of the injector 8 is connected with a collector terminal of an N-P-N type switching transistor 70 for the holding current and a collector terminal of an N-P-N type transistor 73 for a valve opening current through a load resistor 72.

The switching transistor 70 is connected at its emitter terminal with a current detecting resistor 71 and grounded and connected at its base terminal with an output terminal of a comparator 75 through an amplifier 74. On the other hand, the transistor 73 is grounded at its emitter terminal and connected at its base terminal with an inverting Q output terminal of a monostable multivibrator 77 through an inverter 79.

The monostable multivibrator 77 is connected at its input terminal with an injection pulse input terminal 76, connected at its inverting Q output terminal with an input terminal of the inverter 79 and with one input terminal of a two-input AND gate 78. The two-input AND gate 78 is connected at its other input terminal with the injection pulse input terminal 76 and the its output terminal of the AND gate 78 is connected with a voltage dividing resistor 81 and non-inverting input terminal of the comparator 75 through a resistor 80.

The comparator 75 is connected at its inverting input terminal with the current detecting resistor 71. And the comparator 75 compares a logic output voltage of the AND gate 78 inputted from the non-inverting input terminal with the voltage inputted from inverting input terminals across the current detecting resistor 71 to drive the switching transistor 70.

The injector driving circuit 62c has a shut-off circuit 82 outputting a signal for forcibly cutting off the switching transistor 70 when the injection pulse signal is OFF. The shut-off circuit 82 has a comparator 83 which is connected at its non-inverting input terminal with the injection pulse input terminal 76 and connected at its inverting input terminal with voltage dividing resistors 84, 85 for dividing a constant-voltage power source VC. The comparator 83 is an open collector output type, and is connected at its output terminal with the constant-voltage power source VC through a resistor 86 and with a base terminal of the switching transistor 70.

Numeral 87 indicates a flywheel circuit connected in parallel with the injector 8 to input a holding pulse to be described later in more detail from an AND gate 78 thereby to discharge a counterelectromotive force generated in the injector 8 when the switching transistor 70 is cut off, thereby suppressing a variation in the current. Numeral 88 designates a constant-voltage Zener diode.

Figure 2:
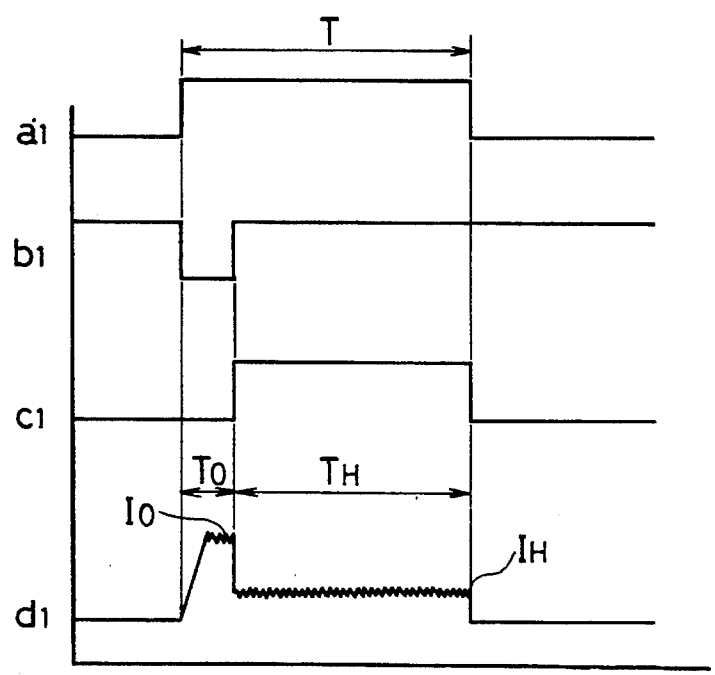
FIG. 2 is a flowchart of signal waveforms of various sections.

When the injection pulse signal having a pulse width T shown by a1 in FIG. 2 is input to the injection pulse input terminal 76 of the injector driving circuit 62c of the configuration as described above (signal waveforms of a1 to d1 of FIG. 1 are shown in FIG. 2), the monostable multivibrator 77 is triggered by the rise of the injection pulse signal, and a voltage opening pulse (a waveform shown by b1 of FIG. 2) for supplying a valve opening current is outputted as a control signal from the inverting Q output terminal to the AND gate 78 and the inverter 79 for a predetermined time T0.

The valve opening pulse is inverted by the inverter 79, and a voltage for a high level is applied to the base of the transistor 73 for the valve opening current. Then, the transistor 73 is switched on for a predetermined time T0, a collector current to be determined in accordance with the load resistor 72 flows as the valve opening current (I0 of FIG. 2) of the injector 8 to open the injector 8. At this time, the output of the AND gate 78 is a logic "0", the output of the comparator 75 is a low level and the switching transistor 70 for the holding current is OFF.

After the predetermined time T0 is elapsed, the transistor 73 for the valve opening current is OFF, the output of the AND gate 78 is logic "1", and a holding pulse shown by c1 in FIG. 2 is outputted as next control signal for a predetermined time TH. The holding pulse is applied to the non-inverting input terminal of the comparator 75 through the resistor 80, and the switching transistor 70 is so switched by a predetermined frequency through the amplifier 74 that the current to be detected by the current detecting resistor 71 becomes the holding current shown by IH of FIG. 2.

More specifically, the detected voltage of the current detecting resistor 71 varying in response to the variation in the collector current of the switching transistor 70 is input to the inverting input terminal of the comparator 75, the holding pulse is input to the non-inverting input terminal of the comparator 75, and the voltage values are compared. As a result, when the detected voltage becomes higher than the holding pulse, the output of the comparator 75 becomes a low level, the switching transistor 70 is OFF, and its collector current is reduced. Thus, when the detected voltage becomes lower than the voltage of the holding pulse, the output of the comparator 75 becomes a high level, the switching transistor 70 is again ON to supply the holding current to the injector 8.

The conduction and the stop of the switching transistor 70 is repeated to control the switching transistor 70 ON and OFF by the holding current value necessary to hold the valve opening state by the current flowing to the injector 8, thereby maintaining the injector 8 in the open state. Therefore, the holding current IH flowing to the injector 8 becomes a sawtooth wave as shown by d1 of FIG. 2.

On the other hand, a reference voltage divided from the constant-voltage power source VC is applied to the inverting input terminal of the comparator 83, and the reference voltage is so set as to become an intermediate potential of the voltage value of the injection pulse signal. Therefore, the output transistor of the comparator 83 is OFF when the injection pulse signal having a pulse width T is applied from the terminal of the injection pulse input terminal 76 to the non-inverting input terminal, and the injection pulse signal is disconnected in a circuit in a zone T where the injection pulse signal is ON.

When the injection pulse signal is OFF to become the timing for stopping conduction of the injector 8, the output transistor of the comparator 83 is ON to forcibly set the base potential of the switching transistor 70 to a low level, thereby completely cut off the switching transistor 70.

At this time, the control signal output of the AND gate 78 becomes a logic "0". The actual signal voltage is a voltage regarded a logic "0" lower than threshold voltage or lower and hence not completely "0". Therefore, the comparator 75 might be erroneously operated. Even in such a case, the switching transistor 70 is completely cut off by a signal from the comparator 83.

More specifically, even after the injection pulse signal is OFF, no current flows to the injector 8, a small current continuously does not flow to the injector 8 to prevent the valve closing force from being weakened, thereby preventing leakage of the high pressure fuel.

Figure 5:
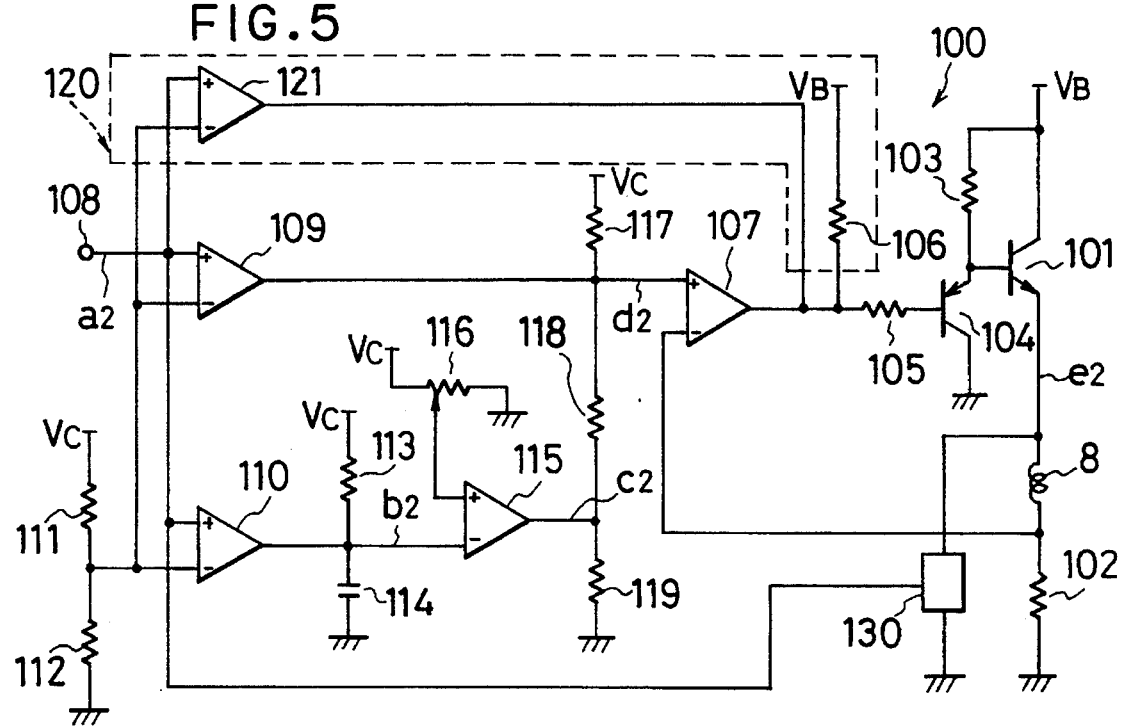
FIG. 5 is a circuit diagram of a driving circuit of a fuel injector according to a second embodiment of the present invention.
Figure 6:
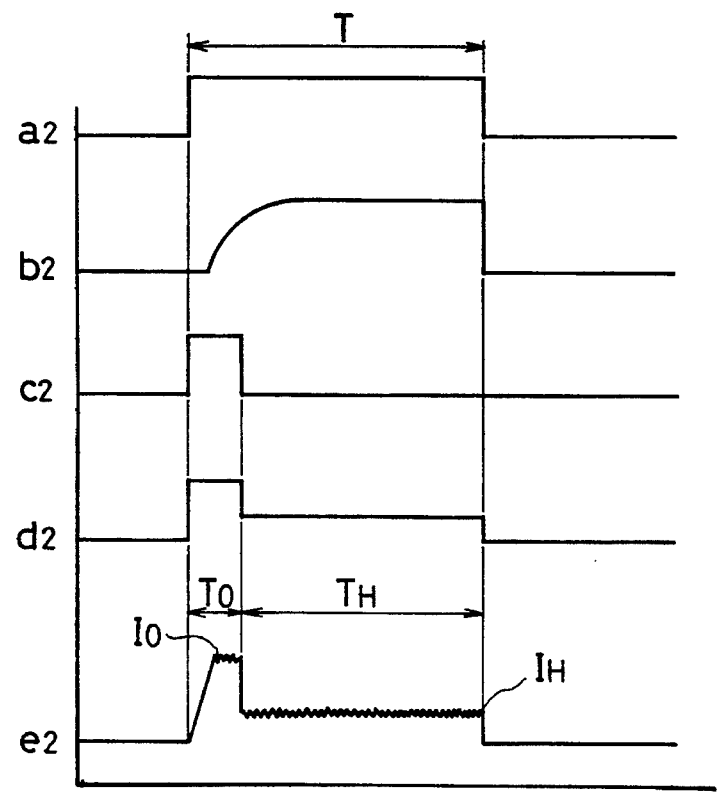
FIG. 6 is a flowchart of signal waveforms of various sections.

FIGS. 5 and 6 show a second embodiment of the present invention. FIG. 5 is a circuit diagram of an injector driving circuit, and FIG. 6 is a signal waveform diagram of various sections.

This second embodiment has an injector driving circuit 100 instead of the injector driving circuit 62c of the first embodiment described above, and the other configuration is the same as that of the first embodiment.

As shown in FIG. 5, a collector terminal of a driving N-P-N type transistor 101 is connected to a battery power source VB in the injector driving circuit 100 of the second embodiment. An injector 8 is connected to an emitter terminal of the driving transistor 101, and grounded through a current detecting resistor 102. Further, a flywheel circuit 130 for inputting an injection pulse signal to discharge a counterelectromotive force generated in the injector 8 at the time of switching off the driving transistor 101 to suppress a variation in the current, similarly to the first embodiment is connected in parallel with the injector 8 and the current detecting resistor 102.

An emitter terminal of a P-N-P type transistor 104 grounded at its collector is connected to the base terminal of the driving transistor 101, and connected to the battery power source VB through a resistor 103. An output terminal of a comparator 107 for controlling the collector current of the driving transistor 101 is connected to the base terminal of the transistor 104 for the signal through a resistor 105.

On the other hand, non-inverting input terminals of comparators 109, 110 for generating a stepped voltage and a comparator 121 for forming a shut-off circuit 120 for forcibly cutting off the driving transistor 101 similarly to the first embodiment are connected to an injection pulse input terminal 108. Voltage dividing resistors 111, 112 for dividing the constant-voltage power source VC are connected to the inverting input terminals of the comparators 109, 110, 121, and a reference voltage of an intermediate potential of the voltage values of the injection pulse signal is applied thereto.

An output terminal of the comparator 110 is connected to a capacitor 114 connected to the constant-voltage power source VC through a resistor 113 and connected to an inverting input terminal of the comparator 115. A variable resistor 116 is connected to the non-inverting input terminal of the comparator 115, and a reference voltage divided from the constant-voltage power source VC is applied.

Voltage dividing resistors 117, 118, 119 are connected in series with the constant-voltage power source VC, grounded, the output terminal of the comparator 109 is connected to a connecting point of the voltage dividing resistors 117 and 118, and connected to the non-inverting input terminal of the comparator 107. An output terminal of the comparator 115 is connected to a connecting point of the voltage dividing resistors 118 and 119.

Further, an output terminal of the comparator 121 is connected to the battery power source VB through a resistor 106, and connected to the base terminal of the transistor 104 for the signal through the resistor 105. The comparators 107, 109, 110, 115 and 121 are all open-collector output type.

When the injection pulse signal having a pulse width T shown by a2 in FIG. 6 is input to the injection pulse input terminal 108 of the injector driving circuit 100 of this second embodiment (signal waveforms of a2 to e2 of FIG. 5 are shown in FIG. 6), output transistors of the comparator 109, 110, 121 are OFF, a terminal voltage of the capacitor 114 is raised from the constant-voltage power source VC through a resistor 113 at a predetermined time constant as shown by b2 of FIG. 6, and applied to the inverting input terminal of the comparator 115.

A reference voltage divided by a variable resistor 116 from the constant-voltage power source VC is applied to the non-inverting input terminal of the comparator 115. Since the output transistor of the comparator 115 is OFF when the terminal voltage of the capacitor 114 is lower than the reference voltage, an output voltage of the comparator 115 becomes a divided voltage (shown by c2 of FIG. 6) of the constant-voltage power source VC to be applied to a resistor 119. Then, when the terminal voltage of the capacitor 114 exceeds the reference voltage, the output transistor of the comparator 115 is ON, and the output side voltage of the comparator 115 becomes a ground potential.

Therefore, when resistance values of the voltage dividing resistors 117, 118 and 119 are R1, R2, R3, respectively, the reference voltage to be input to the non-inverting input terminal of the comparator 107 becomes a voltage of (R2+R3)/(R1+R2+R3) in the case where both the output transistors of the comparators 109 and 115 are OFF, and becomes a voltage of R2/(R1+R2) in the case where the output transistor of the comparator 109 is off and the output transistor of the comparator 115 is ON. The voltage R2/(R1+R2) becomes a voltage lower than the voltage (R2+R3)/(R1+R2+R3).

More specifically, a voltage to be applied to the non-inverting input terminal of the comparator 107 becomes a stepped voltage superposed with the valve opening pulse and the holding pulse as shown by d2 of FIG. 6, and the output transistor of the comparator 107 is OFF by the valve opening pulse, and the transistor 104 for the signal becomes OFF. Therefore, the driving transistor 101 is switched on and a collector current flows the collector of the transistor as the valve opening pulse for a predetermined time T0 so that the potential of the current detecting resistor 102 becomes the valve opening pulse voltage. Thus, the valve opening current I0 as shown by d2 of FIG. 6 flows to open the injector 8.

Then, when the valve opening pulse becomes the holding pulse, the comparator 107 is switched by a predetermined frequency in order that the voltage which is corresponding to a collector current of the drying transistor 101 and which is detected by the current detecting resistor 102 becomes a voltage of the holding pulse, and the holding current IH of the injector 8 becomes a sawtooth wave as shown by e2 of FIG. 6. Since the switching operation is similar to the first embodiment, the detailed description will be omitted.

In this case, the output transistor of the comparator 121 is OFF in a zone T that the injection pulse signal is ON, and disconnected in a circuit. When the injection pulse signal is OFF, the output transistor of the comparator 121 is ON. Thus, a base bias is applied to the P-N-P type transistor 104 to be turned ON to forcibly set the base voltage of the N-P-N type driving transistor 101 to a low level, thereby completely cutting off the driving transistor 101.

More specifically, when the injection pulse signal becomes OFF, the output transistor of the comparator 109 is ON to so operated as to ground the non-inverting input terminal of the comparator 107. However, the potential of the actual non-inverting input terminal does not completely become the ground potential, but becomes higher than a ground potential by the amount corresponding to a saturated voltage of the output transistor. Therefore, it is apprehended that the comparator 107 is erroneously operated to operate the driving transistor 101 in an operating state and a small current might flow to the injector 8, but since the driving transistor 101 is forcibly cut off by the comparator 121, no current flows to the injector 8 similarly to the first embodiment described above, a valve closing force is weakened to prevent the high-pressure fuel from leaking.

In the embodiments described above, cut-off circuits 82, 120 are formed of the comparators 83, 121, respectively. However, the cut-off circuits may be formed of gates of open collector output type or transistors.

According to the present invention as described above, when the injection pulse signal for designating the injection time of the fuel injector becomes off, the signal for forcibly cutting off transistor for driving the fuel injector in the separate system from the control signal formed from the injection pulse signal is outputted from the current. Therefore, the current flowing to the fuel injector can be completely cut off to close the injector and leakage of the fuel from the fuel injector can be prevented.

While the presently preferred embodiments of the present invention have been shown and described, it is to be understood that these disclosures are for the purpose of illustration and that various changes and modifications may be made without departing from the scope of the invention as set forth in the appended claims.

What is claimed is:

1. A driving circuit of a fuel injector for an engine having, an intake passage connected with an intake port of said engine for inducing a fresh air into said engine, an injector mounted on a top of a cylinder head for directly injecting a fuel into a cylinder, a fuel supply system connected from a fuel tank to said injector via a pump and a pressure regulator, an electronic control unit for calculating an injection pulse of said injector and for generating a pulse signal, and an injection pulse input terminal provided in an interface of said electronic control unit for outputting said pulse signal, an improvement of the driving circuit which comprises

- driving means responsive to said pulse signal for calculating a control voltage to actuate said injection and for producing a control signal;
- switching means responsive to said control signal for controlling to open at two predetermined values and to close said injector and for generating a switching signal; and
- a shut-off circuit connected between said injection pulse input terminal and said switching means in parallel with said driving means for forcibly cutting off said switching means when said pulse signal is OFF so as to completely cut off said switching signal to said switching means and to avoid said fuel from leaking in said injector.

2. The driving circuit according to claim 1, wherein said shut-off circuit has a comparator for comparing said pulse signal with a reference voltage of substantially a half of said pulse signal.

3. A driving method of a fuel injector for an engine having, an intake passage connected with an intake port of said engine for inducing a fresh air into said engine, an injector mounted on a top of a cylinder head for directly injecting a fuel into a cylinder, a fuel supply system connected from a fuel tank to said injector via a pump and a pressure regulator, an electronic control unit for calculating an injection pulse of said injector and for generating a pulse signal, and an injection pulse input terminal provided in an interface of said electronic control unit for outputting said pulse signal, an improvement of the driving circuit which comprises the steps of:

- calculating a control voltage to actuate said injector;
- controlling to open at two predetermined values and to close said injector; and
- cutting off said switching means when said pulse signal is OFF so as to completely cut off said switching signal to said switching means and to avoid said fuel from leaking in said injector.

\* \* \* \* \*